United States Patent
Spiro et al.

(10) Patent No.: US 8,460,507 B2
(45) Date of Patent: Jun. 11, 2013

(54) CMP SENSOR AND CONTROL SYSTEM

(75) Inventors: Clifford Spiro, Naperville, IL (US); Edward Remsen, Oswego, IL (US); Thomas Werts, Westmont, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 466 days.

(21) Appl. No.: 12/676,418

(22) PCT Filed: Sep. 3, 2008

(86) PCT No.: PCT/US2008/010343
§ 371 (c)(1),
(2), (4) Date: Mar. 4, 2010

(87) PCT Pub. No.: WO2009/035518
PCT Pub. Date: Mar. 19, 2009

(65) Prior Publication Data
US 2010/0187200 A1 Jul. 29, 2010

Related U.S. Application Data (60) Provisional application No. 60/968,000, filed on Sep. 7, 2007.

(51) Int. Cl.
 *C23F 1/08* (2006.01)
 *C23F 1/00* (2006.01)
 *B24B 37/00* (2006.01)
 *B24B 7/22* (2006.01)

(52) U.S. Cl.
 USPC .................................. 156/345.13; 156/345.15

(58) Field of Classification Search
 USPC .................... 156/345.12, 345.13, 345.15
 See application file for complete search history.

(56) References Cited

U.S. PATENT DOCUMENTS

| | | | |
|---|---|---|---|
| 6,071,818 A * | 6/2000 | Chisholm et al. | 438/692 |
| 6,183,656 B1 * | 2/2001 | Ide et al. | 216/85 |
| 6,440,263 B1 * | 8/2002 | Li et al. | 156/345.12 |
| 6,716,364 B1 * | 4/2004 | Chiesl et al. | 216/84 |
| 6,899,784 B1 * | 5/2005 | Li et al. | 156/345.16 |
| 2010/0187200 A1 * | 7/2010 | Spiro et al. | 216/53 |

FOREIGN PATENT DOCUMENTS

| | | | |
|---|---|---|---|
| JP | 9-131660 | | 5/1997 |
| JP | 09131660 A | * | 5/1997 |
| JP | 2001-053039 A | | 2/2001 |

OTHER PUBLICATIONS

Machine Generated English Translation of JP9131660 published May 20, 1997.*

* cited by examiner

*Primary Examiner* — Sylvia R. MacArthur
(74) *Attorney, Agent, or Firm* — Thomas E. Omholt; Robert J Ross; Steven D. Weseman (57) ABSTRACT

Chemical-mechanical polishing (CMP) systems comprising apparatus and methods which allow the physical and chemical characteristics of a CMP slurry to be monitored during the polishing process, both on the pad and in the fresh slurry, are provided. The methods and apparatus of the invention also furnish the CMP operator with real-time information about the polishing process, which can provide insight into various chemical and physical mechanisms involved in chemical-mechanical polishing. The data provided by the sensors also make available valuable information about the stability and reproducibility of the particular CMP process being observed.

15 Claims, 10 Drawing Sheets

CMP SENSOR AND CONTROL SYSTEM

CROSS-REFERENCE TO RELATED APPLICATIONS

This patent application claims priority to provisional application U.S. Ser. No. 60/968,000, filed on Sep. 7, 2007.

FIELD OF THE INVENTION

This invention relates to chemical-mechanical polishing systems. More particularly, this invention relates to chemical-mechanical polishing apparatus and methods utilizing relatively low-solids abrasive polishing compositions.

BACKGROUND OF THE INVENTION

Many compositions and methods for chemical-mechanical polishing (CMP) the surface of a substrate are known in the art. Polishing compositions (also known as polishing slurries, CMP slurries, and CMP compositions) for polishing metal-containing surfaces of semiconductor substrates (e.g., integrated circuits) typically contain abrasives, various additive compounds, and the like, and frequently are used in combination with an oxidizing agent. Such CMP compositions are often designed for removal of specific substrate materials such as metals (e.g., tungsten or copper), insulators (e.g., silicon dioxide, such as plasma-enhanced tetraethylorthosilicate (PETEOS)-derived silica), and semiconductive materials (e.g., silicon or gallium arsenide).

In conventional CMP techniques, a substrate carrier (polishing head) is mounted on a carrier assembly and positioned in contact with a polishing pad in a CMP apparatus. The carrier assembly provides a controllable pressure ("down force") to urge the substrate against the polishing pad. The pad and carrier, with its attached substrate, are moved relative to one another. The relative movement of the pad and substrate serves to abrade the surface of the substrate to remove a portion of the material from the substrate surface, thereby polishing the substrate. The polishing of the substrate surface typically is further aided by the chemical activity of the polishing composition (e.g., by oxidizing agents and other reactive chemicals present in the CMP composition) and/or the mechanical activity of an abrasive suspended in the polishing composition. Typical abrasive materials include, for example, silicon dioxide (silica), cerium oxide (ceria), aluminum oxide (alumina), zirconium oxide (zirconia), titanium dioxide (titania), and tin oxide.

The abrasive desirably is suspended in the CMP composition as a colloidal dispersion, which preferably is colloidally stable. The term "colloid" refers to the suspension of abrasive particles in the liquid carrier. The term "colloidal stability" and any grammatical variations thereof refers to the maintenance of a suspension of an abrasive particles during a selected period of time with minimal settling. In the context of this invention, an abrasive is considered colloidally stable if, when the suspension of abrasive is placed into a 100 mL graduated cylinder and allowed to stand without agitation for a period of time of 2 hours, the difference between the concentration of particles suspended in the bottom 50 mL of the graduated cylinder ([B] in terms of g/mL) and the concentration of particles suspended in the top 50 mL of the graduated cylinder ([T] in terms of g/mL) divided by the initial concentration of particles in the abrasive composition ([C] in terms of g/mL) is less than or equal to 0.5 (i.e., $([B]-[T])/[C] \leq 0.5$). The value of $([B]-[T])/[C]$ desirably is less than or equal to 0.3, and preferably is less than or equal to 0.1.

U.S. Pat. No. 5,527,423 to Neville et al., for example, describes a method for chemically-mechanically polishing a metal layer by contacting the surface of the metal layer with a polishing slurry comprising high purity fine metal oxide particles suspended in an aqueous medium. Alternatively, the abrasive material may be incorporated into the polishing pad. U.S. Pat. No. 5,489,233 to Cook et al. discloses the use of polishing pads having a surface texture or pattern, and U.S. Pat. No. 5,958,794 to Bruxvoort et al. discloses a fixed abrasive polishing pad.

During polishing, the CMP slurry is continuously deposited onto the polishing pad, and excess slurry is continuously removed from the polishing pad at controlled rates of addition and removal. The CMP slurry on the polishing pad can accumulate waste materials (e.g., components of the substrate that are abraded or chemically etched from the surface of the substrate) during the polishing process, despite the fact that there is a continuous amount of slurry being removed from the pad. These waste materials can have a detrimental effect on the polishing process. For example, accumulation of metal ions, such as copper ions, can catalyze the decomposition of an oxidant, such as hydrogen peroxide, present in the CMP slurry. In addition, various reactive components in the CMP slurry, such as corrosion inhibitors and oxidizing agents, are consumed or degraded during the polishing process, which results in variations in the concentration of such reactive components during the course of polishing, compared to the concentrations in the fresh slurry. As the CMP process progresses, the differences in characteristics between the fresh and used slurry generally will vary over time, reflecting changes in the chemical reactions that are occurring on the substrate surface.

The polishing pad is also abraded and worn away during polishing, and must periodically be replaced when the wear on the pad becomes unacceptable. The CMP slurry present on the pad can accumulate abraded portions of the polishing pad. Often the extent of polishing pad wear, and the resulting decrease in polishing efficiency is not recognized until after a batch of semiconductor wafers has been removed from the polisher for further processing. Reworking or discarding unsatisfactorily polished wafers adds undesirable costs to the wafer manufacturing process.

There is an ongoing need to develop new CMP apparatus and methods for polishing substrates such as semiconductor wafers, in which the physical and chemical characteristics of the polishing slurry can be monitored in close proximity to the substrate during the polishing process, in real-time. The present invention provides such improved CMP apparatus and methods. These and other advantages of the invention, as well as additional inventive features, will be apparent from the description of the invention provided herein.

SUMMARY OF THE INVENTION

The present invention provides chemical-mechanical polishing (CMP) systems comprising apparatus and methods, which allow physical and chemical characteristics of a CMP slurry (e.g., pH, oxidation reduction potential, metal ion concentration, particle size distribution, slurry component concentration, and the like), to be monitored during the polishing process, both on the pad and in the fresh slurry. An apparatus of the invention comprises a movable platen adapted to hold a polishing pad on the platen, a movable polishing head adapted to hold a substrate and to urge a surface of the substrate against the polishing pad at a selected down force, a CMP slurry conveyance system adapted to deposit the CMP slurry onto the surface of the pad and thereby to contact the CMP slurry with the surface of the substrate, and a CMP slurry withdrawal port on or in close proximity to the polishing head. The withdrawal port is in fluid-flow relation with a sampling line, which together are adapted to remove a portion of CMP slurry from the surface of the polishing pad.

During use, the platen and polishing head are disposed in an opposed, parallel relation to one another with the pad and substrate therebetween. The platen and the polishing head move relative one another to provide a frictional force between the polishing pad and the surface of the substrate being urged against the pad to abrade and polish the surface of the substrate. The withdrawal port pulls a stream of used polishing slurry into the sampling line from the surface of the pad near the polishing head and wafer. Physical and/or chemical characteristics of the used slurry in the sampling line then can be analyzed manually or automatically.

In a preferred embodiment, the sampling line is operably connected to one or more sensors adapted to measure at least one physical or chemical characteristic of the used CMP slurry that is present in the sampling line. This provides the CMP operator or engineer with information about the polishing process while polishing is still ongoing. Preferably, the characteristics of the fresh slurry are also monitored and the characteristics of the used slurry are compared to the corresponding characteristics of the fresh slurry to better assess the changes occurring during polishing, and/or to assess the progress and efficiency of the polishing process, in real-time. The CMP operator or engineer can use the observed characteristics, or changes in characteristics to adjust or optimize the polishing conditions and/or to determine when the polishing process is complete. Monitoring the characteristics of the fresh slurry can also be beneficial as a process control parameter, so ensure that the make-up of the fresh slurry is within defined specifications throughout the polishing process.

In some embodiments, the physical or chemical characteristic can be related to a metal ion or other chemical concentration in the slurry, which can provide the operator with information relating to the extent of polishing (e.g., polishing depth) that has been achieved. In other embodiments, the physical or chemical characteristic that is measured can be the concentration of polishing pad debris or a pad-wear marker present in the used slurry due to physical breakdown or wear of the pad. In yet other embodiments, the pH, oxidation reduction potential (ORD), conductivity, concentration of a slurry component, or other characteristic is determined. When the physical or chemical characteristic being measured is found to be beyond a predetermined tolerance level of a set specification for that characteristic, the polishing conditions (e.g., slurry feed rate, down force, platen speed, carrier speed, slurry dilution level, pad conditioning, and the like) can be adjusted to bring the characteristic of the slurry back into specification, if desired.

The methods and apparatus of the invention also provide the CMP operator with real-time information about the polishing process, which can provide insight into various chemical and physical mechanisms involved in chemical-mechanical polishing. The data provided by the sensors also provides valuable information about the stability and reproducibility of the particular CMP process being observed.

DETAILED DESCRIPTION A PREFERRED EMBODIMENT

A CMP apparatus of the invention comprises a movable platen adapted to hold a polishing pad on the platen, a movable polishing head adapted to hold a substrate and to urge a surface of the substrate against the polishing pad at a selected down force, a CMP slurry conveyance system adapted to deposit the CMP slurry onto the surface of the pad and thereby to contact the CMP slurry with the surface of the substrate, and a CMP slurry withdrawal port on or in close proximity to the polishing head. The withdrawal port is in fluid-flow relation with a sampling line, which together are adapted to remove a portion of CMP slurry from the surface of the polishing pad. Preferably, the sampling line is adapted to operably engage one or more sensors (referred to herein as a "used-slurry characteristic" sensors) that are capable of measuring a physical or chemical characteristic of the slurry present in the sampling line.

In some preferred embodiments of the apparatus, the sampling line includes an in-line, used-slurry characteristic sensor adapted to measure a physical or chemical characteristic of the CMP slurry that is withdrawn from the surface of the pad and to transmit a first output signal related to the physical or chemical characteristic to a first data receiving device during the course of polishing the substrate.

In other preferred embodiments, the apparatus can include an in-line, a sensor can be operably engaged with the slurry conveyance system to measure a physical or chemical characteristic of the CMP slurry prior to depositing the CMP slurry onto the polishing pad (i.e., a "fresh-slurry characteristic" sensor), and to transmit a second output signal related to the physical or chemical characteristic of the CMP slurry to a second data receiving device during the course of polishing the substrate. The first and second data receiving devices can be a single device that is capable of receiving and/or processing multiple output signals, if desired.

The slurry characteristics measured by the various sensors in the apparatus of the invention include, for example, pH, oxidation-reduction potential, conductivity, hydrogen peroxide concentration, metal ion concentration, turbidity, particle size distribution, near-infrared absorbance, ultraviolet absorbance, fluorescence, and visible wavelength light absorbance, or a combination thereof. Preferably, the sensors exhibit a linear response to the characteristic being measured over the desired range of values for the characteristic, although this is not an absolute requirement.

The apparatus of the invention can comprise a data receiving device adapted to receive the first out-put signal, the second output signal, or both output signals. The data receiving device can also include a data display device, and/or a microprocessor for calculating a slurry quality parameter from the first output signal, the second output signal, or both output signals.

The slurry withdrawal port is positioned in close proximity to the wafer and polishing head. In some embodiments the withdrawal port is adjacent to the polishing head, while in other embodiments the slurry withdrawal port is attached to the polishing head.

The used-slurry characteristic sensor can comprise a single sensor or a plurality of sensors, which are responsive to different physical or chemical characteristics of the CMP slurry present in the sampling line. Similarly, the fresh-slurry characteristic sensor can comprise a single sensor or a plurality of sensors, which are responsive to different physical or chemical characteristics of the CMP slurry prior to being deposited onto the pad surface.

In the apparatus of the present invention, the used-slurry characteristic sensor can be responsive to a marker substance present in the polishing pad, which is released from the pad as the polishing pad wears away during polishing, if desired. The marker substance in the pad can comprise a pigment, a dye, or a combination thereof. In addition or alternatively, the used-slurry characteristic sensor and/or the fresh-slurry characteristic sensor, can be responsive to a marker substance present in the CMP slurry, such as an inert pigment, an inert dye, or a combination thereof. Such marker substances can be used to ensure that the dilution level of the slurry is within specification. In some embodiments, the marker substance comprises a functional component of the CMP slurry, in which case the concentration of that functional component (e.g., hydrogen peroxide or a corrosion inhibitor) can be monitored during the CMP process. When the measured level of the marker substance is found to be out of specification, the slurry composition or other processing parameters can be adjusted to bring the marker back into specification.

In a preferred embodiment, the used-slurry characteristic sensor and/or the fresh-slurry characteristic sensor comprise an in-line hydrogen peroxide sensor having a linear response curve for hydrogen peroxide at concentrations in the range of zero to 4 percent by weight hydrogen peroxide. Such sensors are commercially available from a variety of sources.

The CMP methods of the present invention can be used to polish any suitable substrate, and are especially useful for polishing semiconductor substrates comprising materials such as metal oxides (e.g., PETEOS), semiconductors (e.g., polysilicon, gallium arsenide), metals, combinations thereof, and the like.

The CMP methods of the present invention are particularly suited for use in conjunction with a chemical-mechanical polishing apparatus of the invention. The CMP methods of the invention utilize a CMP apparatus including a polishing pad mounted on the platen, and a substrate mounted on the polishing head. The platen and carrier assembly are disposed in opposed parallel relation to one another with a surface of the substrate in contact with the pad. The method comprises depositing a CMP slurry between the surface and the pad via the CMP slurry conveyance system, moving the platen relative to the polishing head while urging the substrate against the pad at a selected down force, and withdrawing a portion of the CMP slurry from the pad through the CMP slurry withdrawal port into the sampling line for analysis of a used-slurry physical or chemical characteristic of the used slurry in the sampling line. Preferably, the apparatus includes a used-slurry characteristic sensor operably connected to the sampling line, and a first output signal from the used-slurry characteristic sensor is detected. The output signal of the sensor is related to a physical or chemical characteristic of the withdrawn CMP slurry. The polishing of the substrate is accomplished by the combined abrasive action of the moving polishing pad and the CMP composition of the invention present on the polishing pad, which abrades at least a portion of the surface of the substrate, and thereby polishes the surface. Preferably, the apparatus includes a fresh-slurry characteristic sensor operably engaged with the slurry conveyance system, as well.

In some preferred method embodiments, the polishing conditions are adjusted during the polishing process in response to the output signal or to a physical or chemical characteristic of the withdrawn CMP slurry calculated from the output signal. The polishing conditions can be adjusted automatically in response to the first output signal or the physical or chemical characteristic of the withdrawn CMP slurry, or can be adjusted manually. In some embodiments, the physical or chemical characteristic of the withdrawn CMP slurry is compared to the corresponding characteristic of the fresh CMP slurry, to determine how the used slurry has changed during polishing. The difference between the characteristics of the used slurry and the fresh slurry can be used to gauge the progress and efficiency of the polishing process, and as an indicator for how the process may need to be adjusted.

The methods and apparatus of the present invention can utilize any suitable polishing pad (e.g., polishing surface). Non-limiting examples of suitable polishing pads include woven and non-woven polishing pads, which can include fixed abrasives, if desired. Moreover, suitable polishing pads can comprise any suitable polymer of having any suitable density, hardness, thickness, compressibility, ability to rebound upon compression, and compression modulus. Suitable polymers include, for example, polyvinylchlorides, polyvinylfluorides, nylons, polymeric fluorocarbons, polycarbonates, polyesters, polyacrylate esters, polyethers, polyethylenes, polyamides, polyurethanes, polystyrenes, polypropylenes, coformed products thereof, and mixtures thereof. In some preferred embodiments, the polishing pad can optionally include a wear-marker (e.g., one marker substance or a plurality of marker substances), such as a pigment, a dye, or both. The marker preferably is spatially distributed in the pad in a manner that allows the CMP operator to determine the degree of wear on the pad based on the amount and type of wear marker that is detected in the slurry during polishing.

The CMP apparatus optionally can include an in situ polishing endpoint detection system, many of which are known in the art. Techniques for inspecting and monitoring the polishing process by analyzing light or other radiation reflected from a surface of the workpiece are known in the art. Such methods are described, for example, in U.S. Pat. No. 5,196, 353 to Sandhu et al., U.S. Pat. No. 5,433,651 to Lustig et al., U.S. Pat. No. 5,949,927 to Tang, and U.S. Pat. No. 5,964,643 to Birang et al. Desirably, the inspection or monitoring of the progress of the polishing process with respect to a workpiece being polished enables the determination of the polishing end-point, i.e., the determination of when to terminate the polishing process with respect to a particular workpiece.

Suitable recording and display devices for receiving and displaying the output signals of the various sensors utilized in the present invention include analog and digital devices. Non-limiting examples of analog devices include plotters, strip charts, cathode ray tubes, and the like. Digital recording devices typically include a microprocessor for receiving, storing, and/or processing the output signal and for converting the signal into a human or machine readable format, and preferably include a display device and/or a data storage device.

Adjustment of CMP processing conditions or parameters (e.g., slurry feed rate, slurry composition, down force, carrier speed, platen speed, and the like) can be performed automatically, in direct response to the output signal of the sensor, or in response to a feedback signal from the recording device. Alternatively, the processing conditions can be adjusted manually based on the output signal or suitable output from the recording device.

Some CMP processes utilize a point-of-use mixing of two reagents (e.g., hydrogen peroxide and a peroxide-free polishing slurry). One aspect of the present invention provides an alternative to periodically calibrating the flows of each subsystem. For example, two inert dyes of different absorbance characteristics (e.g., different colors) can be included, one in the first component and one in the second component. A sensor (or sensors) that is capable of measuring absorbance or transmittance at two different wavelengths can be used in an apparatus of the invention to monitor the mixing process by detecting the ratio of the two marker materials in the mixed slurry. Feedback from the sensor can be used to adjust the feed rates of each component in real-time to maintain the proper mixing ratio. The sensor can be designed to monitor the components before the slurry is deposited on the pad, after depositing the slurry on the pad, or both.

Generally, pad wear results from the pad conditioning disk, which continually abrades the surface of the pad during polishing. In another embodiment, a CMP apparatus of the invention can be used in conjunction with a polishing pad that includes dyes and/or pigments embedded in the pad is an predetermined pattern. For example, the center region of a circular polishing pad might include a red pigment or dye, and the outer region of the pad might include a blue pigment or dye. By monitoring the concentration of each marker, the CMP engineer can determine the center-to-edge wear pattern of the pad in real time, and can schedule pad replacement more efficiently. In addition, the CMP engineer can adjust the pad conditioning in response to the output from the sensor, to increase or decrease the pad wearing rate, as needed.

Similarly, the apparatus of the invention can be used to monitor the size distribution of pad debris released into the slurry during polishing. Debris size can be related to the degree of pad conditioning. Over conditioning can lead to larger pad debris particles, while under conditioning can lead to abnormally small pad debris particles. Sensors for determining pad debris size or for measuring release of marker compounds include, without limitation, turbidometers, fluorometers, visible light spectrometers, and conductivity meters.

In another embodiment, simultaneous measurement of several physical and chemical characteristics of the CMP slurry, such as turbidity, pH, redox potential, electrical conductivity, hydrogen peroxide concentration, and monitoring of specific polishing byproducts (e.g., metal ions) utilizing the apparatus and methods of the present invention can provide the CMP engineer with insights into the chemical and physical processes taking place during polishing. Continuous monitoring of several slurry characteristics can provide the CMP engineer with a multifaceted picture of the entire polishing process, which leads to a better understanding, and ultimately to improvements of the process. In addition, the resulting data can be used as a "fingerprint" for a given process. Deviations from the typical observed fingerprint could be used as an early indication that there is a processing problem.

The detection of individual chemical components of the slurry (e.g., corrosion inhibitors or hydrogen peroxide), or materials released into the slurry during polishing (e.g., metal ions such as copper) can also be enhanced by addition of chemical reagents that interact with the components to provide a more readily observable signal. For example, hydrogen peroxide in the slurry can be reacted with a color forming reagent prior to being detected with the inline sensor, so that a colorimetric detector can be used to specifically monitor the hydrogen peroxide level or a component of the CMP slurry (e.g., an amino-substituted component) can be reacted with a tag (e.g., a fluorescent tag) to aid in quantifying the concentration of the component in the used slurry.

The following examples and the drawing figures referred to therein further illustrate various aspects of the methods and apparatus of the present invention.

Figure 1:
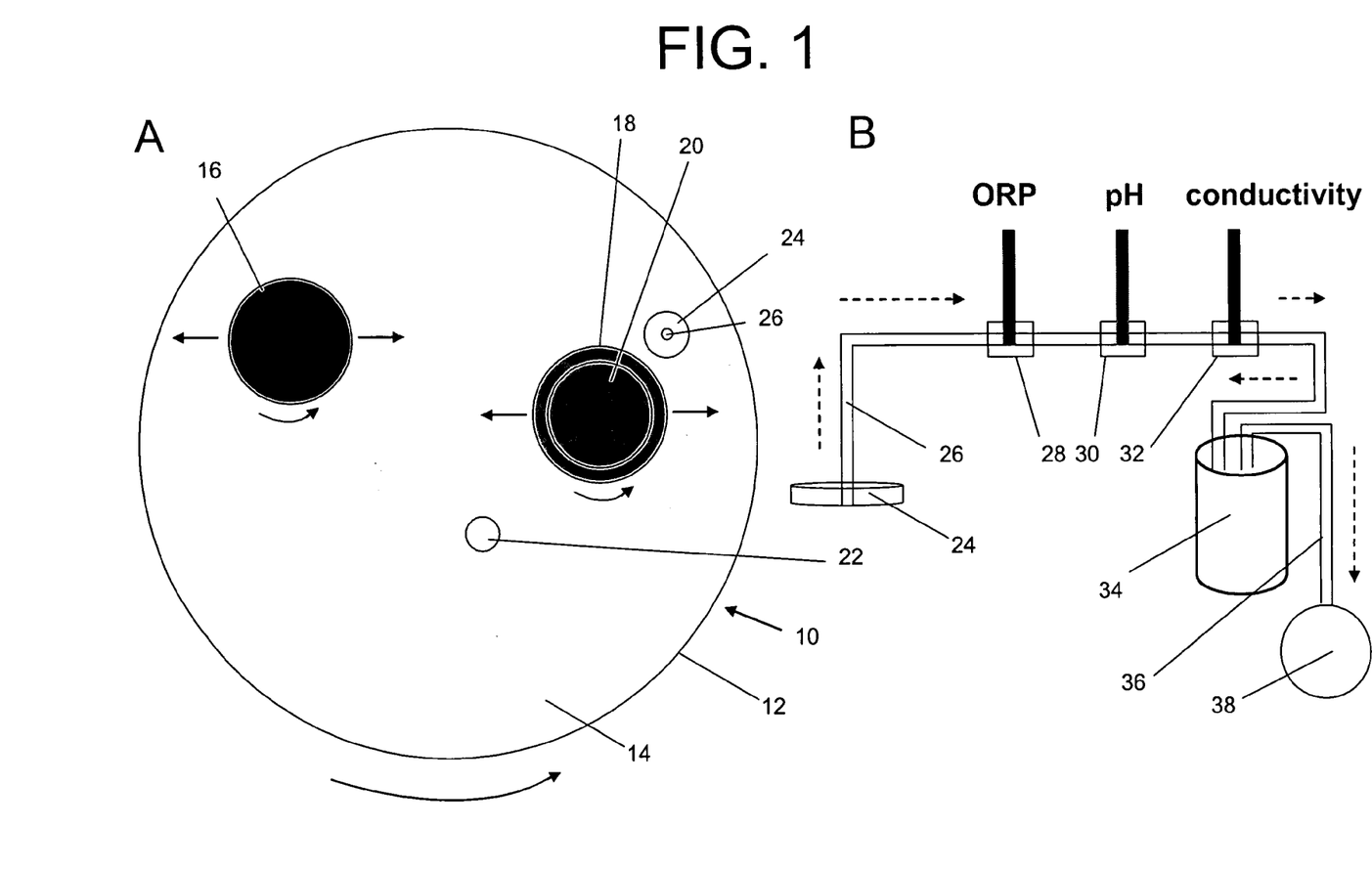
FIG. 1 schematically illustrates one embodiment of the apparatus of the present invention; Panel A provides a top view, while Panel B provides a partial side view.

FIG. 1 schematically illustrates one embodiment of the apparatus of the present invention with a polishing pad and wafer (workpiece) mounted on the apparatus as they would be during use. Panel A shows a top view of polishing apparatus 10, which includes a movable platen 12 having a polishing pad 14 mounted to its upper surface, movable conditioning head 16 in contact with polishing pad 14, movable polishing head 18 having semiconductor wafer 20 (the substrate to be polished) mounted thereon, in contact with polishing pad 14, a slurry inlet 22 for depositing CMP slurry onto polishing pad 20, and slurry withdrawal port 24 situated in close proximity to wafer 20 and polishing head 18. Slurry withdrawal port 24 is in fluid-flow relation to slurry sampling line 26. Platen 12 with its attached polishing pad 14, is adapted to rotate at a selected platen speed. Conditioning head 16 is adapted to move by rotational, lateral, and/or orbital motion across the surface of polishing pad 14 to condition the surface of the pad by continually abrading the surface. Polishing head 18, with attached wafer 20, is adapted to move by rotational, lateral, and/or orbital motion across the surface of polishing pad 14 with a surface of wafer 20 being urged against polishing pad 14 at a selected down force. In use, an abrasive-containing CMP slurry is deposited onto the surface of polishing pad 14 to aid in the polishing of wafer 20 by providing additional mechanical abrasion and chemical etching of the wafer surface. Slurry withdrawal port 14 is adapted to move in a manner which allows it to remain in close proximity to wafer 20 during the polishing process, and is also adapted to remove used CMP slurry from the surface of polishing pad 14 for analysis.

Panel B of FIG. 1 provides a schematic side view of a portion of apparatus 10, further illustrating sample line 26, which, in this embodiment, includes three in-line slurry characteristic sensors 28, 30, and 32. Sampling line 26 is in fluid-flow relation to collection vessel 34, which is operably connected to vacuum line 36. Vacuum line 36 is adapted for connection to vacuum source 38, which provides a suction force to draw off samples of used CMP slurry from polishing pad 14 through withdrawal port 24 and sampling line 26. Sensors 28, 30, and 32 detect and measure chemical and/or physical parameters of the CMP slurry. In Panel B of FIG. 1, sensor 28 is shown as an oxidation-reduction potential (ORP) sensor, sensor 30 is shown as a pH sensor, and sensor 32 is shown as a conductivity sensor. Each of sensors 28, 30, and 32 are adapted to transmit output signals to one or more data receiving devices (not shown).

Figure 2:
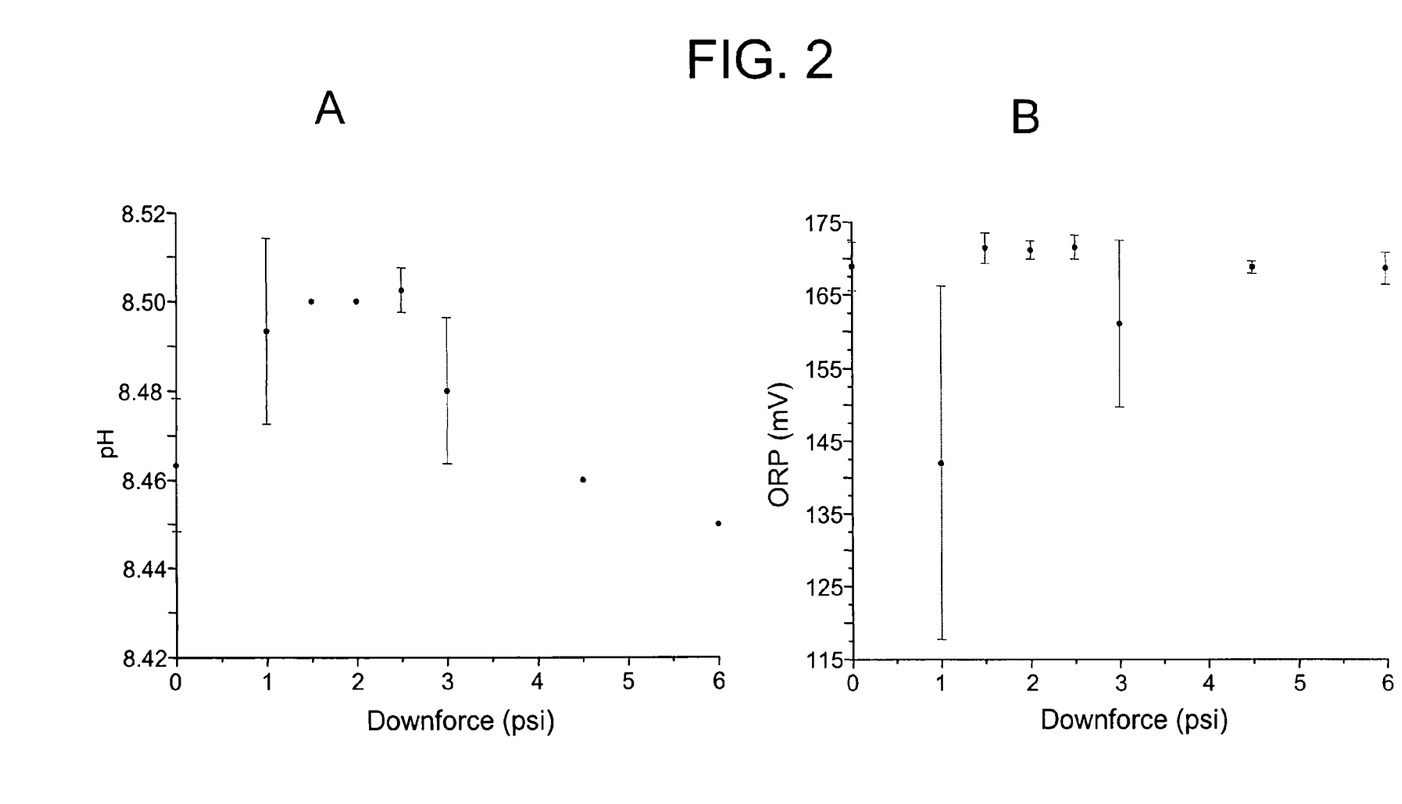
FIG. 2 shows graphs of pH and ORP versus down force for C7092 CMP slurry used to polish a copper blanket wafer at various down forces.
Figure 3:
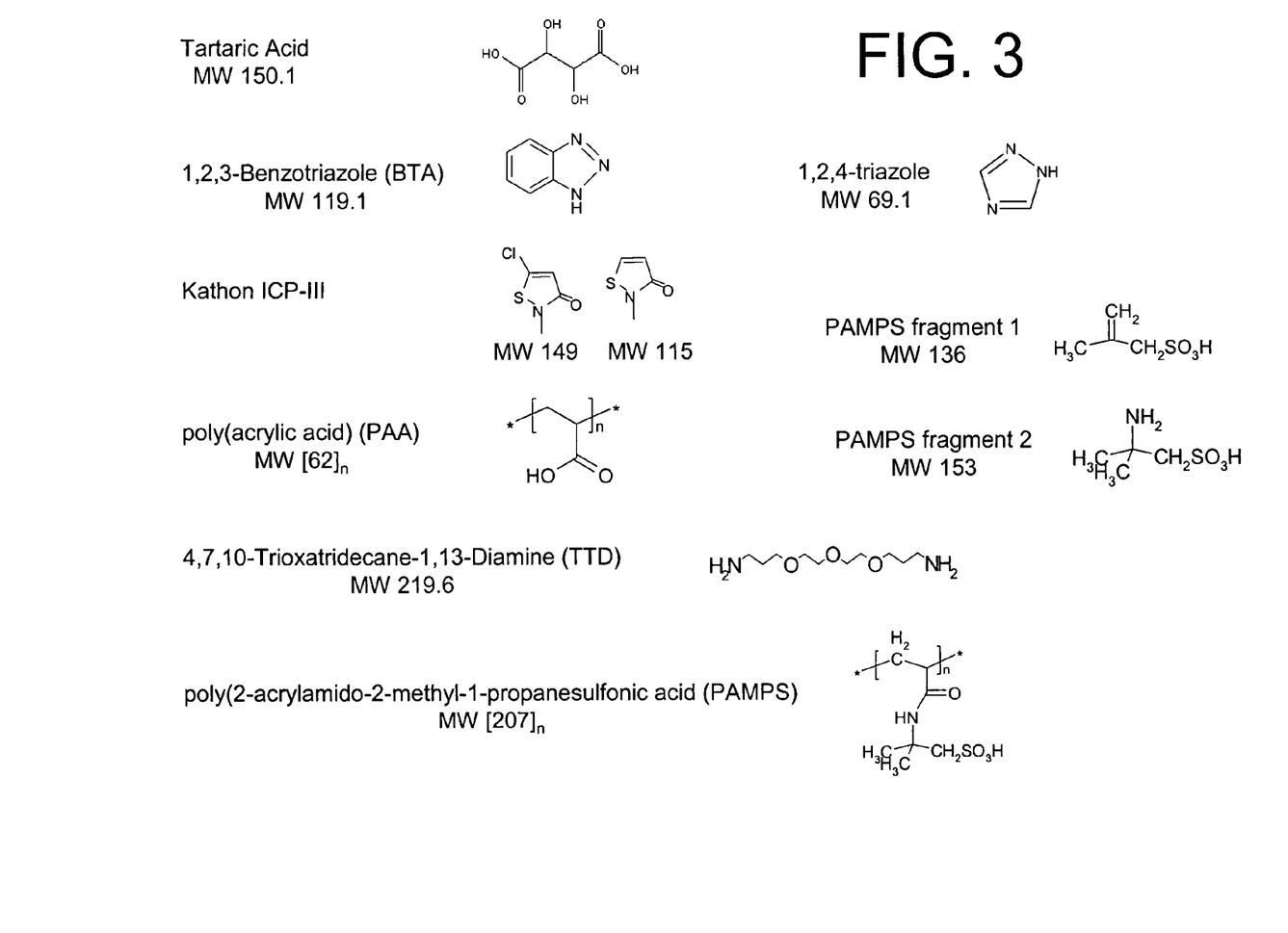
FIG. 3 shows various components of C7092 CMP slurry.

FIG. 2 shows graphs illustrating pH and ORP responses observed in used CMP slurry during polishing of 4-inch copper wafers on a Logitech CMP apparatus equipped with a D100 polishing pad at varying down forces using a CMP slurry comprising alpha-alumina (85 nm mean particle size), benzotriazole, polyAMPS, tartaric acid, and other components as shown in FIG. 3 (C7092), combined with 1 percent by weight hydrogen peroxide. The slurry flow rate was 150 milliliters-per-minute (mL/min), the polishing time was 2 minutes, the platen speed was 80 revolutions-per-minute (rpm), and the polishing head carrier speed was 65 rpm. The down force was varied from 0.5 pounds-per-square inch (psi) to 6 psi. Panel A shows pH response as a function of down force, while Panel B shows the ORP response as a function of down force. The data in FIG. 2 show that the pH of the used slurry is more sensitive to down force variation than is ORP.

Figure 4:
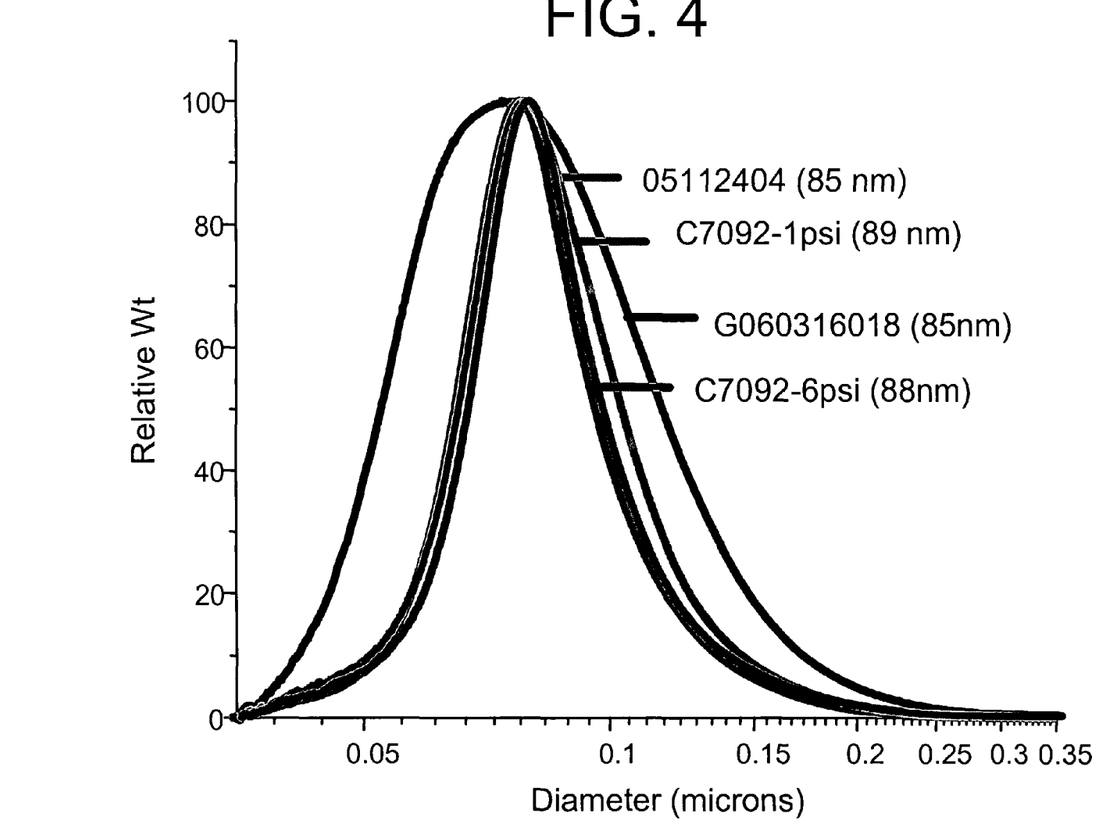
FIG. 4 shows graphs of particle size distribution for fresh and used C7092 CMP slurry.

FIG. 4 provides graphs of apparent particle size distribution for a fresh C7092 CMP slurry (labeled G060316018), used slurry obtained after polishing a 4-inch copper blanket wafer at a down force of 1 psi (labeled C7092-1 psi), and used slurry obtained after polishing a 4-inch copper blanket wafer at a down force of 6 psi (labeled C7092-6 psi) under the polishing conditions described in the preceding paragraph, compared to a sample of fresh, unformulated alpha-alumina suspension used to prepare the CMP slurry, as received from the manufacturer (labeled 05112404). The results show that after polishing, the apparent particle size distribution of the slurries appears to be very similar to unformulated fresh alpha-alumina, indicating that the polishing process causes a narrowing of the particle size distribution for the formulated CMP slurry.

Figure 5:
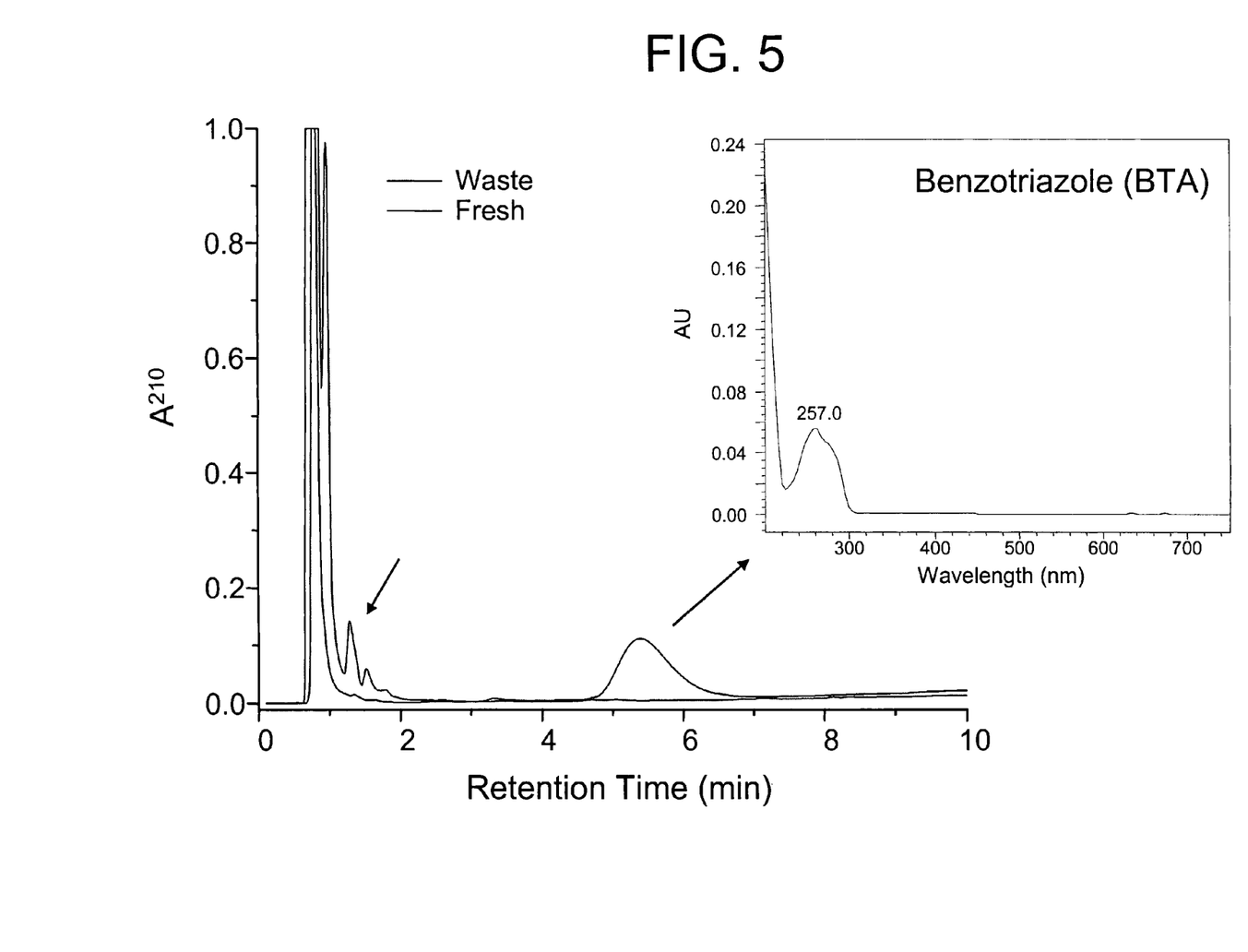
FIG. 5 shows HPLC traces of fresh and used C7092 CMP slurries.

FIG. 5 provides a high performance liquid chromatography (HPLC) trace of the liquid phase from a fresh C7092 CMP slurry, and used slurry obtained after polishing a 4-inch copper blanket wafer at a down force of 2 psi under the following conditions polishing time—one minute, slurry flow rate—100 mL/min, platen speed—93 rpm, carrier speed—67 rpm. The inset shows the UV-Vis spectrum of the peak at 5.3 minute from the fresh slurry (benzotriazole). Comparison of the fresh and used slurry chromatographs indicates that the benzotriazole degraded during polishing.

Figure 6:
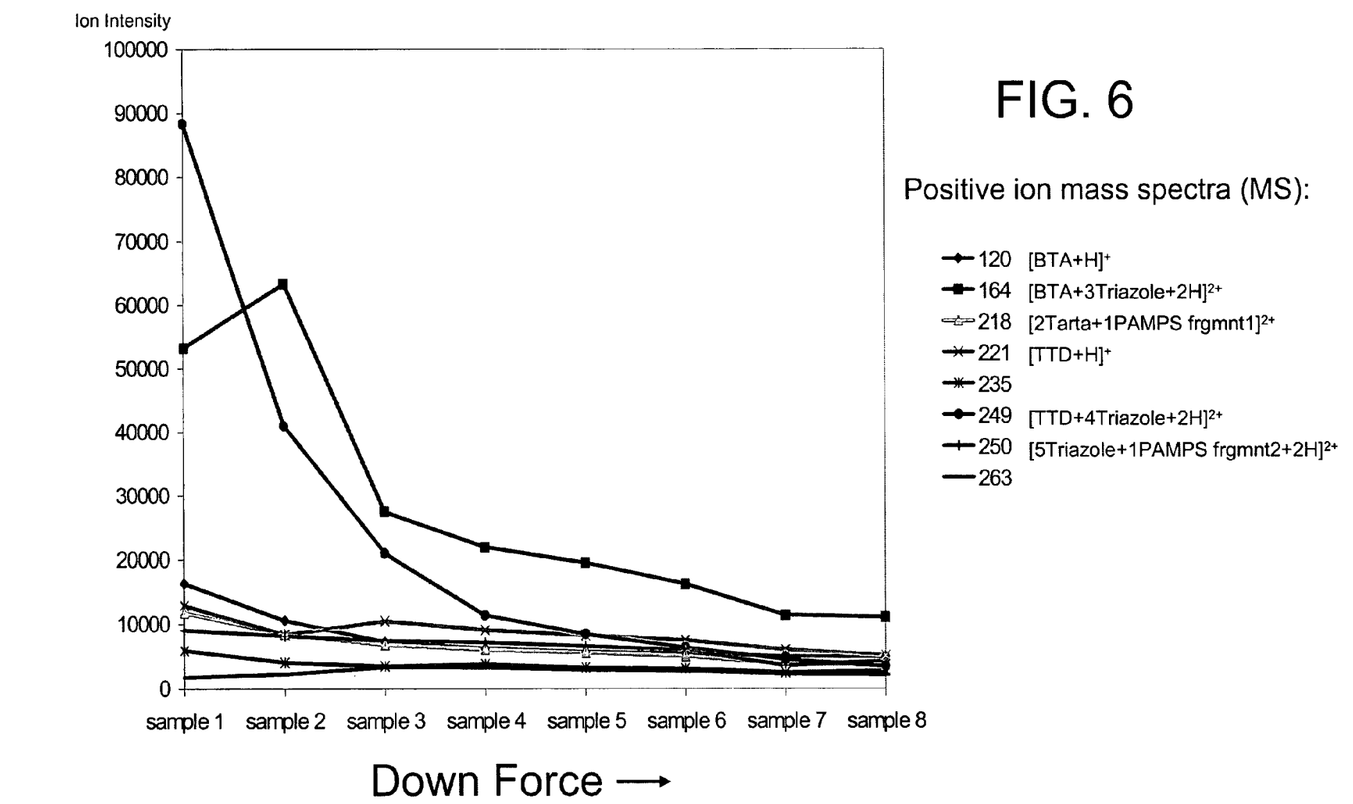
FIG. 6 shows positive ion mass spectral data from C7092 CMP slurries after use at various down forces.
Figure 7:
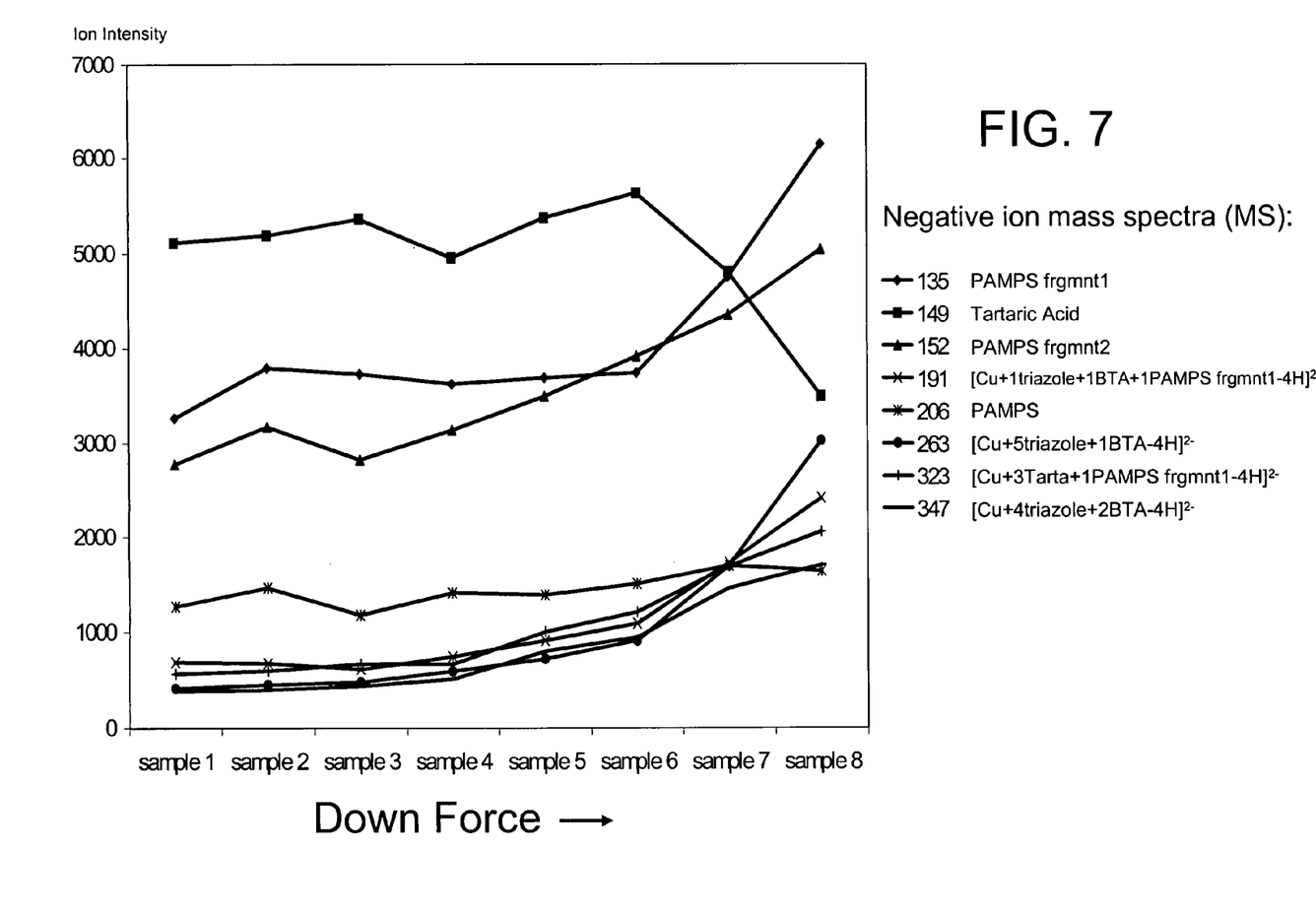
FIG. 7 shows negative ion mass spectral data from C7092 CMP slurries after use at various down forces.

FIG. 6 provides graphs showing positive ion mass spectral data from fresh and used C7092 CMP slurry showing the intensity of signals from benzotriazole and various benzotriazole byproducts, as a function of the polishing down force (down force was varied from 1 to 6 psi at an interval of 0.5 psi for down force<3.5 psi, and an interval of 1.5 psi for down force>3.5 psi). The data confirm that benzotriazole degrades as a function of down force. FIG. 7 provides graphs showing negative ion mass spectral data from fresh and used CMP slurry showing the intensity of signals from various slurry components (polyAMPS, tartaric acid) and various byproducts formed during CMP (e.g., copper chelated with triazoles, benzotriazole and polyAMPS; PolyAMPS fragments), further confirming that chemical changes in the slurry occur during CMP, which are affected by the down force used during the polishing process.

Figure 8:
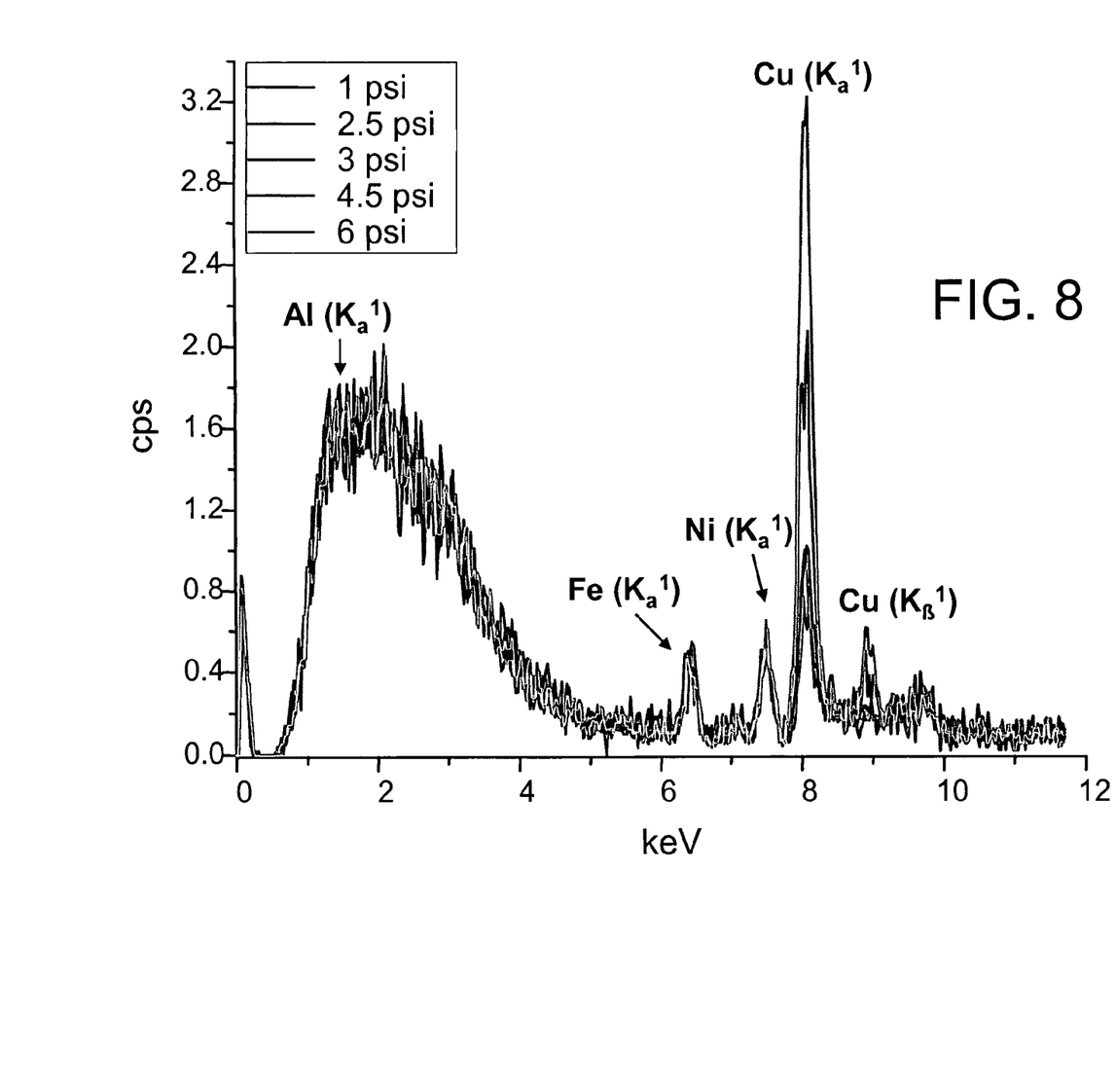
FIG. 8 shows x-ray fluorescence (XRF) data from C7092 CMP slurries used at various down forces.

FIG. 8 provides graphs showing x-ray fluorescence (XRF) data from fresh and used C7092 CMP slurry illustrating the build up of copper in the slurry as a function of down force. The data indicate that copper concentration in the slurry increases with increasing down force.

Figure 9:
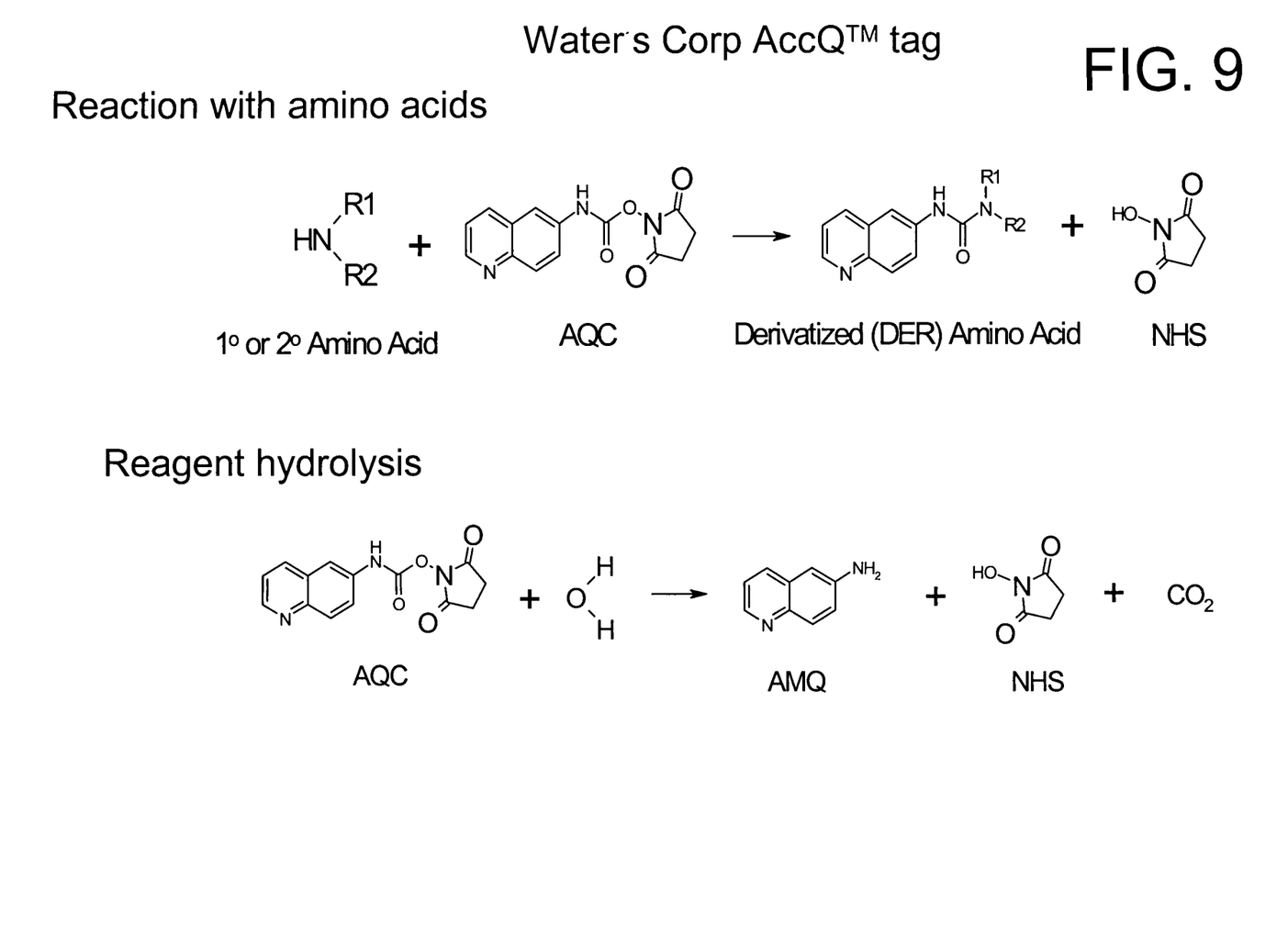
FIG. 9 shows chemical reaction schemes for an amine tagging system.
Figure 10:
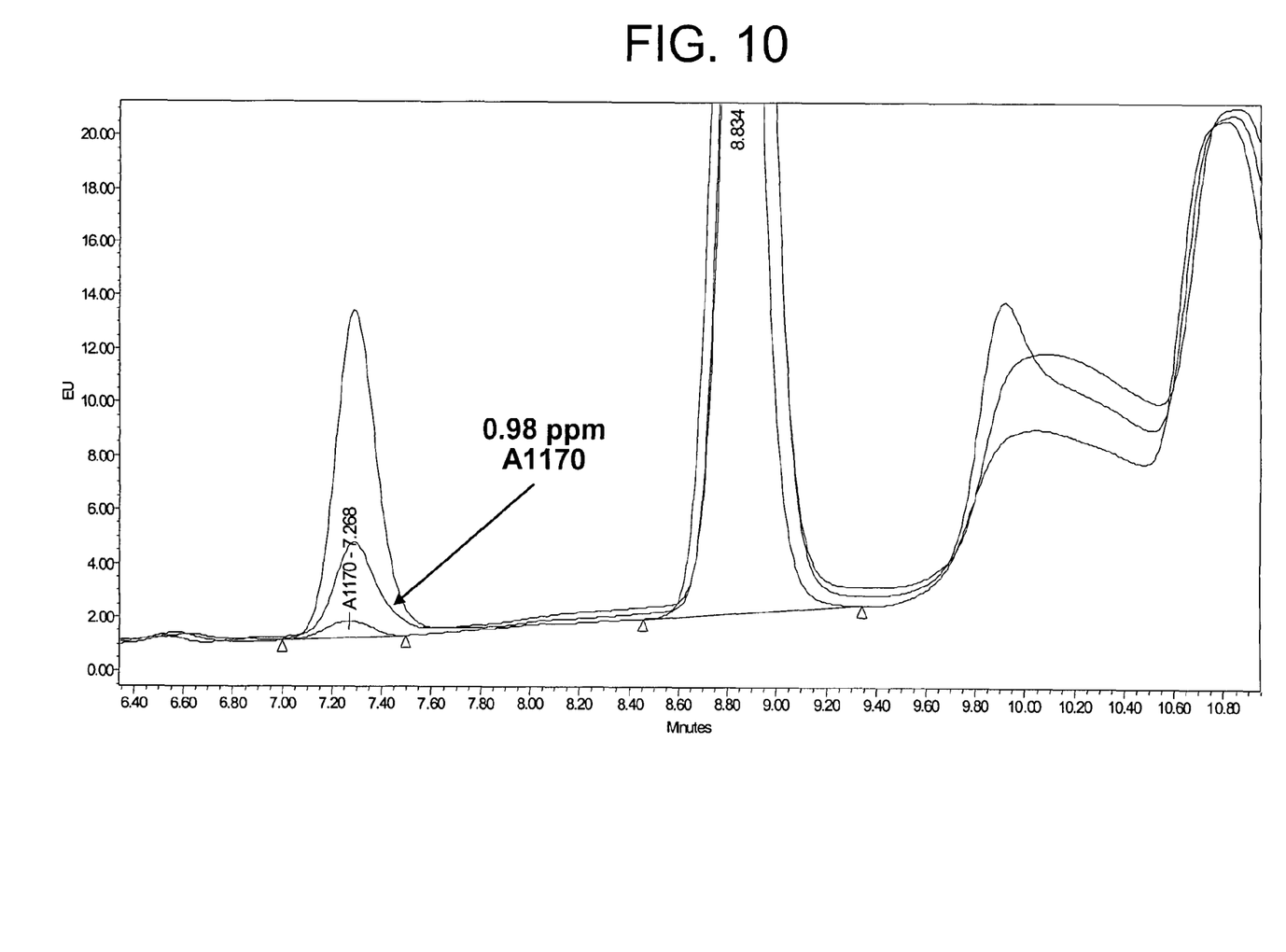
FIG. 10 shows HPLC data obtained utilizing an amine tagging system as shown in FIG. 9 with C7092 CMP slurries used at various down forces.

FIG. 9 shows reaction schemes for tagging primary and secondary amine components of CMP slurries with a fluorescent tag (Waters ACCQ™ tag). FIG. 10 provides HPLC traces showing that slurry component A1170, an aminosiloxane, can be quantitatively analyzed using ACCQ™ tag and HPLC.

The results described in FIGS. 2 and 4-10 demonstrate that a number of slurry components degrade during CMP, that the rate of degradation often is positively correlated with the CMP down force, and that various analytical techniques can be used to quantitatively measure various slurry components. The apparatus and methods of the present invention incorporate analytical sensors for real-time analysis of various physical and chemical characteristics of the CMP slurry, so that changes in the slurry that occur during CMP can be monitored, and where appropriate, polishing conditions, such as down force or slurry composition, can be varied to compensate for the changes in the slurry.

The invention claimed is:

1. An apparatus for use in chemical-mechanical polishing (CMP) process comprising a movable platen adapted to hold a polishing pad on the platen; a movable polishing head adapted to hold a substrate and to urge a surface of the substrate against the polishing pad at a selected down force; a CMP slurry conveyance system adapted to deposit a CMP slurry onto a surface of the pad and thereby to contact the CMP slurry with the surface of the substrate; and a CMP slurry withdrawal port on or in close proximity to a polishing head, the withdrawal port being in fluid-flow relation with a sampling line, the withdrawal port and sampling line together being adapted to remove a portion of the CMP slurry from the surface of the polishing pad, thus forming a used CMP slurry line;

wherein, during use, the platen and polishing head are disposed in an opposed, parallel relation to one another with the pad and substrate therebetween; the platen and the polishing head moving relative one another to provide a frictional force between the polishing pad and the surface of the substrate being urged against the pad to abrade and polish the surface of the substrate, and the sampling line providing a stream of used slurry for determination of a physical or chemical characteristic thereof, and wherein the sampling line includes an in-line used-slurry characteristic sensor adapted to measure a physical or chemical characteristic of the used slurry that is withdrawn from the surface of the pad and to transmit a first output signal related to the physical or chemical characteristic to a first data receiving device during the course of polishing the substrate, and wherein the CMP slurry conveyance system includes an in-line fresh-slurry characteristic sensor adapted to measure a physical or chemical characteristic of the CMP slurry prior to depositing the CMP slurry onto the polishing pad, and to transmit a second output signal related to the physical or chemical characteristic of the CMP slurry to a second data receiving device during the course of polishing the substrate.

2. The apparatus of claim 1 wherein the sampling line is adapted to operably engage a used-slurry characteristic sensor, which is adapted to measure a physical or chemical characteristic of the used CMP slurry present in the sampling line.

3. The apparatus of claim 1 wherein the used-slurry characteristic sensor, the fresh-slurry characteristic sensor, or both sensors, are adapted to measure a slurry characteristic selected from the group consisting of pH, oxidation-reduction potential, conductivity, hydrogen peroxide concentration, metal ion concentration, turbidity, particle size distribution, near-infrared absorbance, ultraviolet absorbance, fluorescence, and visible wavelength light absorbance.

4. The apparatus of claim 3 further comprising a data receiving device adapted to receive the first output signal, the second output signal, or both output signals.

5. The apparatus of claim 4 wherein the data receiving device includes a data display device.

6. The apparatus of claim 4 wherein the data receiving device includes a microprocessor for calculating a slurry quality parameter from the first output signal, the second output signal, or both output signals.

7. The apparatus of claim 1 wherein the slurry withdrawal port is positioned adjacent to the polishing head.

8. The apparatus of claim 1 wherein the slurry withdrawal port is attached to the polishing head.

9. The apparatus of claim 1 wherein the used-slurry characteristic sensor comprises a plurality of sensors, which are responsive to different physical or chemical characteristics of the CMP slurry present in the sampling line.

10. The apparatus of claim 1 wherein the fresh-slurry characteristic sensor comprises a plurality of sensors, which are responsive to different physical or chemical characteristics of the CMP slurry prior to being deposited onto the pad surface.

11. The apparatus of claim 1 wherein the used-slurry characteristic sensor is responsive to a marker substance present in the polishing pad, which is released from the pad as the polishing pad wears away during polishing.

12. The apparatus of claim 11 wherein the marker substance comprises a pigment, a dye, or a combination thereof.

13. The apparatus of claim 1 wherein the used-slurry characteristic sensor is responsive to a marker substance present in the CMP slurry.

14. The apparatus of claim 13 wherein the marker substance comprises an inert pigment, an inert dye, or a combination thereof.

15. The apparatus of claim 13 wherein the marker substance comprises a functional component of the CMP slurry.

* * * * *